(12) United States Patent
Yoon et al.

(10) Patent No.: US 7,919,378 B2
(45) Date of Patent: Apr. 5, 2011

(54) TRANSISTOR AND METHOD OF FORMING THE SAME

(75) Inventors: Jae-Man Yoon, Seoul (KR); Choong-Ho Lee, Gyeonggi-do (KR); Dong-Gun Park, Gyeonggi-do (KR); Chul Lee, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 107 days.

(21) Appl. No.: 12/397,176

(22) Filed: Mar. 3, 2009

(65) Prior Publication Data
US 2009/0170271 A1 Jul. 2, 2009

Related U.S. Application Data

(62) Division of application No. 11/070,598, filed on Mar. 1, 2005, now Pat. No. 7,521,766.

(30) Foreign Application Priority Data

Mar. 4, 2004 (KR) .............................. 2004-0014530

(51) Int. Cl.
*H01L 21/336* (2006.01)
(52) U.S. Cl. ................. 438/280; 257/E29.122

(58) Field of Classification Search .................. 438/280; 257/E29.122
See application file for complete search history.

(56) References Cited

U.S. PATENT DOCUMENTS

| | | | |
|---|---|---|---|
| 4,996,574 | A | 2/1991 | Shirasaki |
| 6,100,125 | A | 8/2000 | Hulfachor et al. |
| 6,294,817 | B1 | 9/2001 | Srinivasan et al. |
| 6,413,802 | B1 | 7/2002 | Hu et al. |
| 6,429,091 | B1 | 8/2002 | Chen et al. |
| 6,525,403 | B2 | 2/2003 | Inaba et al. |
| 6,570,217 | B1 | 5/2003 | Sato et al. |
| 6,599,789 | B1 | 7/2003 | Abbott et al. |
| 6,642,090 | B1 | 11/2003 | Fried et al. |
| 2002/0159287 | A1 | 10/2002 | Miwa et al. |

*Primary Examiner* — Bradley K Smith
*Assistant Examiner* — Amar Movva
(74) *Attorney, Agent, or Firm* — Harness, Dickey & Pierce, P.L.C.

(57) ABSTRACT

According to some embodiments of the invention, a fin type transistor includes an active structure integrally formed with a silicon substrate. The active structure includes grooves that form blocking regions under source/drain regions. A gate structure is formed to cross the upper face of the active structure and to cover the exposed side surfaces of the lateral portions of the active structure. An effective channel length of a fin type transistor may be sufficiently ensured so that a short channel effect of the transistor may be prevented and the fin type transistor may have a high breakdown voltage.

12 Claims, 13 Drawing Sheets

TRANSISTOR AND METHOD OF FORMING THE SAME

CROSS REFERENCE TO RELATED APPLICATION

This application is a Divisional of U.S. patent application Ser. No. 11/070,598, filed on Mar. 1, 2005, now pending, which claims priority under 35 U.S.C. §119 from Korean Patent Application No. 2004-0014530, filed on Mar. 4, 2004, in the Korean Intellectual Property Office, the entire contents of which are hereby incorporated by reference

BACKGROUND OF THE INVENTION

1. Field of the Invention

The present invention relates to a semiconductor device and a method of forming the same. More particularly, the present invention relates to a fin type transistor capable of preventing a short channel effect, reducing a leakage current, and reducing a junction capacitance in source/drain regions, and a method of forming the transistor.

2. Description of the Related Art

As the semiconductor industry rapidly develops, the semiconductor devices have minute sizes and improved degree of integration. Since the semiconductor devices have minute sizes, structures of the semiconductor devices also have minute dimensions. For example, the size of an active region of the semiconductor device greatly decreases so that a channel length of the semiconductor device also decreases.

When a channel length of a transistor is reduced, source/drain regions of the transistor may be greatly affected by an electric field in depletion layers adjacent to the source/drain regions. This phenomenon is referred to as a short channel effect. Also, a depletion layer adjacent to the drain region is extended in proportional to an augmentation of a drain voltage so that the depletion layer adjacent to the drain region is closely extended to a depletion layer adjacent to the source region. As a result, when the channel length is reduced, the depletion layer adjacent to the drain region is connected to the depletion layer adjacent to the source region. Since an electric field in the drain region affects the source region, an electric potential for diffusing electrons in the source region is lowered. Thus, although the channel region may not be formed between the source/drain regions, a current flows between the source/drain regions. This phenomenon is referred to as punch-through.

To overcome the above-mentioned problems, various methods for reducing sizes of semiconductor devices while improving characteristics of the semiconductor devices have been studied and developed. For example, there have been developed a vertical fin type transistor, a fully depleted lean-channel transistor (DELTA), a transistor having a gate all around (GAA) structure, etc.

An exemplary conventional fin type transistor is disclosed in U.S. Pat. No. 6,413,802. The fin type transistor includes thin fin shape channels disposed in parallel on a silicon-on-insulator (SOI) substrate. The fin shape channels are positioned between source/drain regions. A gate electrode extends along upper faces and sidewalls of the channel fins. In the conventional fin type transistor, since the gate electrode is formed on both sides of the fin shape channels, an effective area of the gate electrode is controlled by both sides of the fin shape channels, thereby reducing a short channel effect.

However, since the fin shape channels are arranged along a direction parallel to the gate electrode, the channel region and the source/drain regions may have relatively wide areas. Also, since the number of the channels is relatively large, a leakage current and a junction capacitance in the source/drain regions may be increased.

An exemplary DELTA is disclosed in U.S. Pat. No. 4,996,574. This transistor includes a channel layer for forming a channel region. The channel layer having a uniform width is vertically protruded from a substrate. A gate electrode encloses the protruded portion of the channel layer. Thus, a height of the protruded portion of the channel layer substantially corresponds to a width of the channel layer. Also, a width of the protruded portion substantially corresponds to a thickness of the channel layer. In this transistor, since both sides of the channel layer may be utilized, the width of the channel layer may be about doubled so that a reverse narrow width effect may be prevented. Further, when the width of the protruded portion is reduced, depletion layers formed on both sides of the channel layer may be overlapped to increase a conductivity of the channel layer.

However, when the DELTA is formed on a bulk silicon substrate, the bulk silicon substrate is processed to have a protruding portion that serves as a channel region. After an oxidation prevention layer covers the protruding portion, the bulk silicon substrate is oxidized. If the bulk silicon substrate is excessively oxidized, a portion of the bulk silicon substrate adjacent to the protruding portion is oxidized by oxygen because the oxidation prevention layer is formed on the protruding portion only. Hence, the protruding portion may be separated from the bulk silicon substrate. If the protruding portion is spaced apart from the bulk silicon substrate, a channel region of the DELTA may be greatly reduced and also the bulk silicon substrate may be greatly damaged due to a stress generated in the oxidation of the bulk silicon substrate.

On the contrary, when the DELTA is formed on a silicon-on-insulator (SOI) substrate, a channel region of the DELTA is formed to have a narrow width by partially etching the SOI substrate. Thus, the above problem caused by the excessive oxidation may be prevented when the SOI substrate is oxidized. Here, the width of the channel region is determined in accordance with a thickness of a silicon layer of the SOI substrate. However, because the SOI substrate, particularly a fully depletion-type SOI substrate having a thickness of hundreds of angstroms, the DELTA may have the channel region with an extremely narrow width.

Further, the DELTA does not make direct contact with the silicon substrate. Namely, the DELTA has a floating body. Thus, a floating body effect such as a parasite bipolar-induced breakdown or a latch up may be caused because holes may be accumulated at a rear interface of the SOI substrate.

SUMMARY OF THE INVENTION

Embodiments of the present invention provide a fin type transistor capable of suppressing a short channel effect, reducing a leakage current, and reducing a junction capacitance in source/drain regions.

Embodiments of the present invention also provide a method of forming the above transistor.

In accordance with an embodiment of the present invention, a fin type transistor includes an active structure integrally formed with a semiconductor substrate, an insulation layer pattern formed on the substrate, and a gate structure formed on the upper face of the active structure and the insulation layer pattern. The active structure includes a central portion vertically extended from the substrate, lateral portions horizontally extended from the central portion, and grooves formed at the lateral portions. The central portion may serve as a channel region and the lateral portions may serve as source/drain regions. The insulation layer pattern partially covers the active structures and to expose an upper face of the active structure. The insulation layer pattern includes trenches partially exposing side surfaces of the central portion of the active structure. The gate structure partially encloses the active structure. The active structure is formed by partially etching the substrate. The lateral portions of the active structure may include upper lateral portions and lower lateral portions respectively extended from the central portion, and the grooves respectively interposed between the upper lateral portions and the lower lateral portions. The gate structure may include a central portion crossing the upper face of the active structure, and end portions filling up the trenches. The end portions of the gate structure may have widths wider than a width of the central portion of the gate structure. The gate structure further includes a gate dielectric layer formed on the upper face of the active structure and the exposed side surfaces of the central portion of the active structure, a gate electrode formed on the gate dielectric layer, and a hard mask formed on the gate electrode.

The fin type transistor further includes blocking regions for electrically isolating the source/drain regions from the substrate. The blocking regions may include insulation layer patterns that fill the grooves or voids corresponding to the grooves. The fin type transistor may be employed for an SRAM device or a DRAM device.

In accordance with another embodiment of the present invention, a fin type transistor includes an active structure integrally formed with a semiconductor substrate, an insulation layer pattern formed on the substrate, a gate structure formed on the upper face of the active structure and the insulation layer pattern, source/drain regions formed at upper portions of the active structure adjacent to the gate structure, and blocking regions formed in the grooves. The active structure may include a central portion vertically extended from the substrate, lateral portions horizontally extended from the central portion, and grooves formed at the lateral portions. The central portion may serve as a channel region. The insulation layer pattern partially covers the active structures and exposes an upper face of the active structure. The insulation layer pattern may include trenches partially exposing side surfaces of the central portion of the active structure. The gate structure partially encloses the active structure. The blocking regions electrically isolate the source/drain regions from the substrate.

In accordance with still another embodiment of the present invention, an active structure is integrally formed with a semiconductor substrate. The active structure has a central portion vertically extended from the substrate, lateral portions horizontally extended from the central portion, and grooves formed at the lateral portions. The central portion may serve as a channel region. An insulation layer is formed on the substrate to expose an upper face of the active structure. Blocking regions are formed in the grooves. The insulation layer is partially etched to form an insulation layer pattern including trenches that partially expose side surfaces of the central portion of the active structure. A gate structure is formed on the active structure and the insulation layer pattern. The gate structure crosses the upper face of the active structure and partially encloses the active structure. Then, first impurities are implanted into upper portions of the active structure to form source/drain regions adjacent to the gate structure.

In forming the active structure, after an ion implantation mask is formed on the substrate, second impurities are implanted into portions of the substrate using the ion implantation mask to form ion implantation regions. Then, a hard mask for defining the active structure is formed on the substrate. Finally, after partially etching the substrate using the hard mask to form an active pattern including the ion implantation regions, the ion implantation regions are removed to form the active structure having the grooves. The lateral portions of the active structure may include upper lateral portions and lower lateral portions respectively extended from the central portion, and the grooves respectively interposed between the upper lateral portions and the lower lateral portions. The second impurities may include hydrogen atoms or helium atoms, and the ion implantation regions may have impurity concentrations of about $1\times10^{16}$ atoms/cm$^2$ to about $1\times10^{18}$ atoms/cm$^2$.

In forming the hard mask, a nitride layer is formed on the substrate and the ion implantation mask. After the nitride layer is partially removed to expose the ion implantation mask, a photoresist pattern is formed on the exposed ion implantation mask and the nitride layer. Then, the nitride layer and the ion implantation mask are partially etched using the photoresist pattern as an etching mask to form the hard mask. The nitride layer is partially removed by a chemical mechanical polishing (CMP) process, and the ion implantation mask serves a polishing stop layer in the CMP process.

After the active structure is formed, a side oxide layer and a liner layer may be sequentially formed on the active structure. The blocking regions may include oxide layer patterns filling up the grooves or voids corresponding to the grooves. The gate electrode may include a central portion formed to cross the upper face of the active structure, and end portions formed to cover the exposed side surfaces of the central portion of the active structure.

In forming the gate structure, a gate dielectric layer is formed on the upper face of the active structure and the exposed side surfaces of the central portion of the active structure. A conductive layer is formed on the gate dielectric layer and the insulation layer pattern to fill up the trenches. A nitride layer pattern is formed on the conductive layer. Then, the conductive layer is partially etched using the nitride layer pattern as an etching mask to form a gate electrode partially enclosing the active structure.

In accordance with still another aspect of the present invention, there is provided a method of forming a fin type transistor. In the method of forming the fin type transistor, an active structure is integrally formed with a semiconductor substrate. The active structure includes a central portion vertically extended from the substrate, lateral portions horizontally extended from the central portion, and grooves formed at the lateral portions. An insulation layer is formed on the substrate to expose an upper face of the active structure. After blocking regions are formed in the grooves, the insulation layer is partially etched to form an insulation layer pattern including trenches that partially expose side surfaces of the central portion of the active structure. A gate structure is formed on the active structure and the insulation layer pattern. The gate structure crosses the upper face of the active structure and partially encloses the active structure. First impurities are implanted into upper portions of the active structure to form first impurity regions adjacent to the gate structure. After gate spacers are formed on sidewalls of the gate structure, second impurities are implanted into the upper portions of the active structure to form second impurity regions so that source/drain regions having lightly doped drain (LDD) structures are formed at the upper portions of the active structure.

According to embodiments of the present invention, although a gate structure has a narrow width, an effective channel length of a fin type transistor may be sufficiently ensured. Therefore, a short channel effect of the transistor may be prevented and the fin type transistor may have a high breakdown voltage. Additionally, since the active structure is integrally formed with the substrate and blocking regions are formed under the source/drain regions of the transistor, a junction capacitance of the source/drain regions may be reduced and a leakage current from the source/drain regions may be prevented.

BRIEF DESCRIPTION OF THE DRAWINGS

The above objects and advantages of the present invention will become more apparent by describing exemplary embodiments in detail with reference to the attached drawings.

DETAILED DESCRIPTION OF THE PREFERRED EMBODIMENTS

Figure 1:
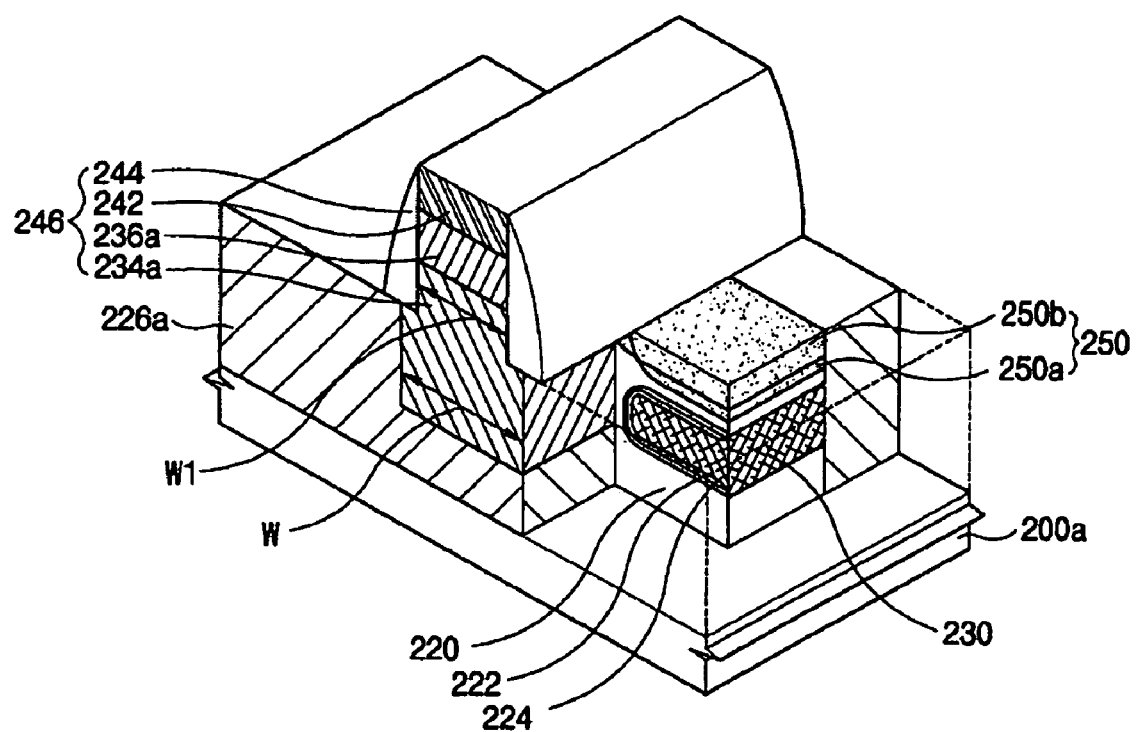
FIG. 1 is a perspective view of a fin type transistor in accordance with an embodiment of the present invention.

The present invention will now be described more fully with reference to the accompanying drawings in which one or more exemplary embodiments of the present invention are shown. In the drawings, the thickness of layers and regions are exaggerated for clarity and like reference numerals refer to like elements throughout. It will be understood that when an element such as an element, layer, region, or substrate is referred to as being "on" or "onto" another element, the element is either directly on the other element or intervening elements may also be present.

FIG. 1 is a perspective view of a fin type transistor in accordance with an exemplary embodiment of the present invention.

Referring to FIG. 1, a fin type transistor of the present invention includes an active structure 220 formed on a semiconductor substrate 200a, an insulation layer pattern 226a, a gate structure 246, source/drain regions 250 and blocking regions 230.

The semiconductor substrate 200a may include a bulk silicon substrate to which an etching process for forming the active structure 220 is performed. That is, the active structure 220 is formed by partially etching the substrate 200a.

The active structure 220 has a central portion vertically extended from the substrate 200a. The central portion of the active structure 220 provides a channel region of the fin type transistor. The active structure 220 has upper lateral portions and lower lateral portions by respectively interposing grooves among the upper lateral portions and the lower lateral portions. The upper and lower lateral portions horizontally extend from the central portion. The upper lateral portions of the active structure 220 provide source/drain regions 250 of the fin type transistor. Thus, the active structure 220 substantially has a rectangular shape wherein the grooves are horizontally formed lateral portions thereof. In other words, the active structure 220 has an I-shaped cross section. Since the active structure 220 is formed by partially etching the semiconductor substrate 200a, the active structure 220 is integrally formed with the semiconductor substrate 200a.

The active structure 220 corresponds to a pattern that is integrally formed with the etched substrate 200a. The active structure 220 may be formed using an isotropic etching process and a damascene process.

The blocking regions 230 are formed in the grooves of the active structure 220, respectively. Side oxide layers 222 and liner layers 224 are formed on inner faces of the grooves. That is, the side oxide layers 222 and the liner layers 224 are formed between the blocking regions 230 and the active structure 220.

The insulation layer pattern 226a is formed on the substrate 200a to cover the active structure 220, whereas an upper face of the active structure 220 is exposed. Also, the insulation layer pattern 226a has trenches partially exposing side surfaces of the central portion of the active structure 220. Thus, the insulation layer pattern 226a partially buries the active structure 220, whereas the side surfaces of the active structure 220 are partially exposed through the trenches.

The gate structure 246 is formed on the active structure 220 and the insulation layer pattern 226a. The gate structure 246 is extended along a direction substantially perpendicular to the active structure 220. Thus, the upper face of the active structure 220 is partially exposed when the gate structure 246 is formed. The gate structure 246 has a central portion formed on an upper face of the active structure 220, and end portions filling up the trenches. Namely, the side surfaces of the central portion of the active structure 220 are covered with the end portions of the gate structure 246.

The gate structure 246 includes a gate electrode having a conductive layer pattern 234a and a metal silicide layer pattern 236a sequentially stacked on the active structure 220. The gate structure 246 further includes a hard mask 242 formed on the metal silicide layer pattern 236a, and a gate spacer 244 formed on sidewalls of the gate electrode 242 and the hard mask 242. A width W of the end portions of the gate structure 246 is substantially wider than a width W1 of the central portion of the gate structure 246.

The source/drain regions 250 are formed at the upper lateral portions of the active structure 220. The source/drain regions 250 are adjacent to the gate structure 246. Here, the source/drain regions 250 are formed along a direction substantially perpendicular to the central portion of the gate structure 246. The blocking regions 230 are positioned under the source/drain regions 250. The source/drain regions 250 have lightly doped drain (LDD) structures that respectively includes first impurity regions 250a having relatively high impurity concentrations, and second impurity regions 250b having relatively low impurity concentrations.

The blocking regions 230 are positioned in the grooves of the active structure 220. The blocking region 230 may correspond to the insulation layer patterns filling up the grooves or voids in accordance with the grooves. The source/drain regions 250 are electrically isolated from the substrate 200a by the blocking regions 230.

According to the fin type transistor of embodiments of the present invention, although the gate electrode has a narrow width, a short channel effect of the transistor may be prevented. In addition, the gate structure partially encloses the active structure so that triple channels are formed between the gate structure and the active structure, thereby improving the mobility of carriers moving between the source/drain regions. Furthermore, the blocking regions effectively reduce the junction capacitance of the source/drain regions and a leakage current from the source/drain regions.

The fin type transistor of embodiments of the present invention may be advantageously employed for a DRAM device, an SRAM device, a non-volatile memory device, etc.

FIGS. 2A to 2L are perspective views illustrating a method of forming a transistor in accordance with an embodiment of the present invention.

Figure 2A:
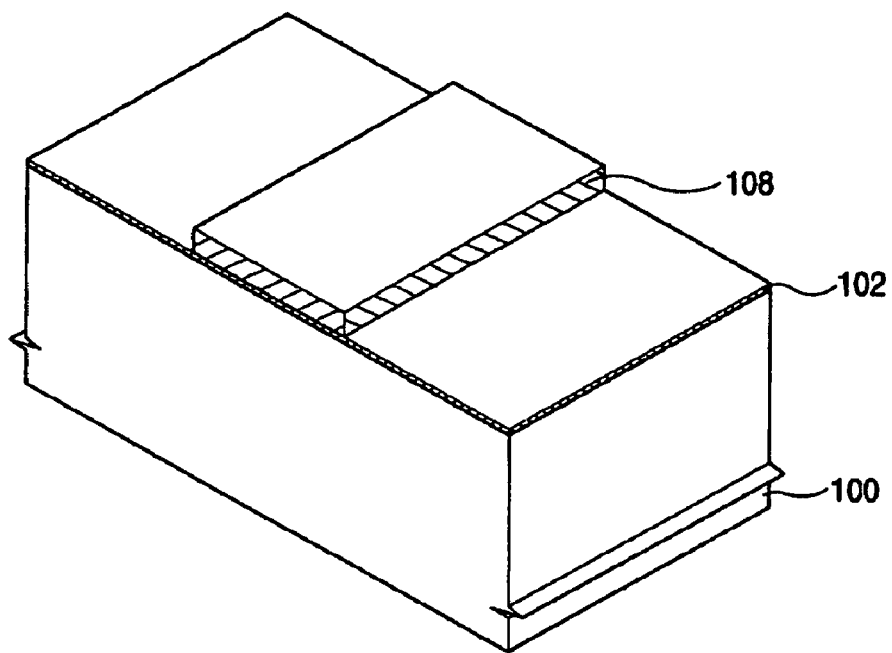
FIGS. 2A to 2L are perspective views illustrating a method of forming a transistor in accordance with another embodiment of the present invention.
Figure 2B:
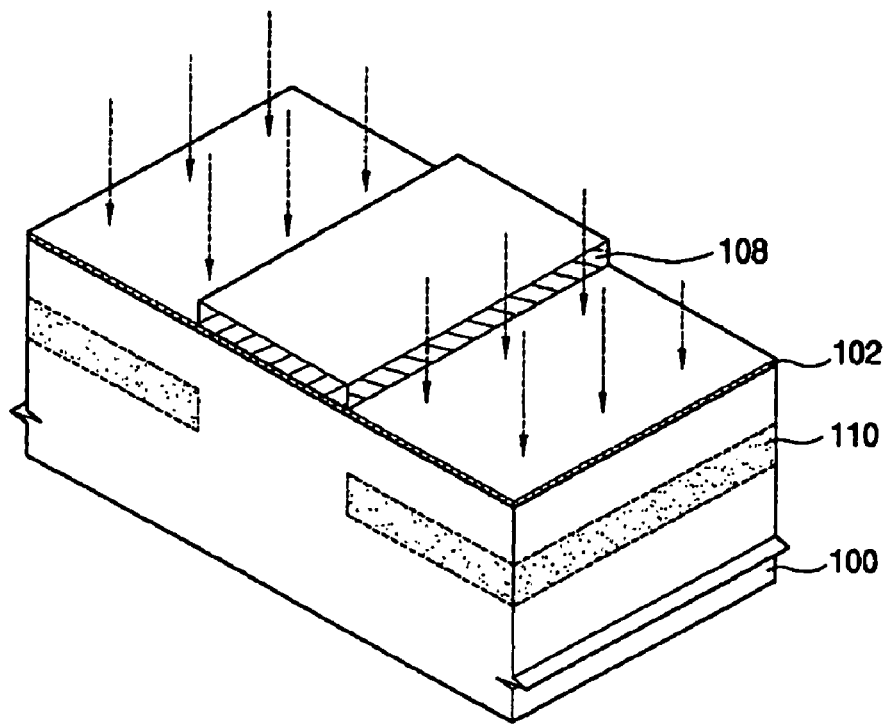

Referring to FIGS. 2A and 2B, after a preliminarily dummy pattern 108 is formed on a pad oxide layer 102 (the process of which is described below) positioned on a semiconductor substrate 100, ion implantation regions 110 are formed at portions of the substrate 100 under the pad oxide layer 102 by implanting impurities along a direction indicated as arrows using the preliminarily dummy pattern 108 as an ion implantation mask. The preliminarily dummy pattern 108 selectively blocks the impurities implanted into the substrate 100 except for the ion implantation regions 110. In the ion implantation regions 110, bonds of silicon atoms are broken in accordance with the implantation of the impurities.

Now the process of forming the pad oxide layer 102 is described. A surface of the substrate 100 is oxidized to form the pad oxide layer 102 thereon. The pad oxide layer 102 may have a thickness of about 100 Å. The pad oxide layer 102 may be formed at a temperature of about 900° C. to about 1,200° C. by providing an oxygen gas onto the surface of the substrate 100. Namely, the pad oxide layer 102 may be formed by a thermal oxidation process.

A dummy layer (not shown) is formed on the pad oxide layer 102. The dummy layer may have a thickness of about 700 Å. The dummy layer may have a double-layered structure that includes a silicon nitride film and a silicon oxide film sequentially formed on the pad oxide layer 102.

After a photoresist pattern (not shown) exposing a portion of the dummy layer is formed on the dummy layer, the exposed portion of the dummy layer is etched using the photoresist pattern as an etching mask until the pad oxide layer 102 is exposed. The dummy layer may be partially etched by a dry etching process. When the exposed portion of the dummy layer is removed, the preliminarily dummy pattern 108 is formed on the pad oxide layer 102. Here, the pad oxide layer 102 prevents the substrate 100 from damage during the etching process of forming the preliminarily dummy pattern 108. Then, the photoresist pattern is removed from the substrate 100 by an ashing process and/or a stripping process.

The impurities are implanted into the portions of the substrate 100 under the pad oxide layer 102 to form the ion implantation regions 110. The impurities are implanted with a concentration of about $1\times10^{16}$ atoms/cm$^2$ to about $1\times10^{18}$ atoms/cm$^2$. The impurities may include atoms having low atomic weights such as hydrogen atoms or helium atoms. The ion implantation regions 110 are formed adjacent to the preliminarily dummy pattern 108.

Figure 2C:
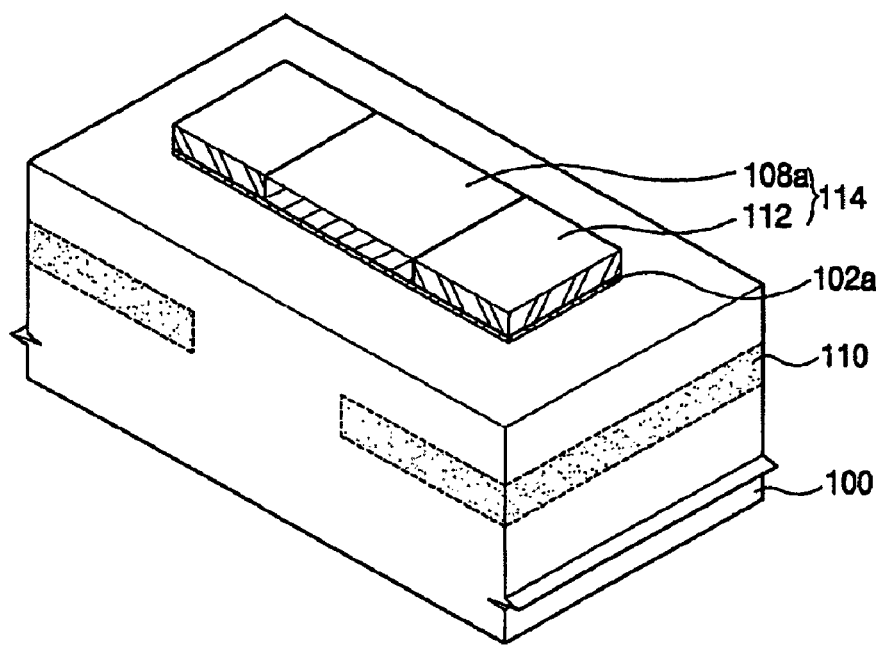

Referring to FIG. 2C, a nitride layer (not shown) is formed on the pad oxide layer 102 to cover the preliminarily dummy pattern 108. The nitride layer may have a thickness of about 700 Å or more. Then, the nitride layer is planarized until the preliminarily dummy pattern 108 is exposed by a planarization process such as a chemical mechanical polishing (CMP) process, an etch back process, or a combination process of CMP and etch back.

After a photoresist pattern (not shown) for defining an active region 116 is formed on the planarized nitride layer and the preliminarily dummy pattern 108, the nitride layer and the preliminarily dummy pattern 108 are partially etched using the photoresist pattern as an etching mask. Accordingly, the first hard mask 114 including nitride layer patterns 112 and a dummy pattern 108a is formed on the pad oxide layer 102. The nitride layer patterns 112 make contact with side portions of the dummy pattern 108a, respectively. When the first hard mask 114 is formed on the pad oxide layer 102, the pad oxide layer 102 is simultaneously etched to form a pad oxide layer pattern 102a beneath the first hard mask 114. That is, the pad oxide layer pattern 102a is formed between the substrate 100 and the first hard mask 114.

Figure 2D:
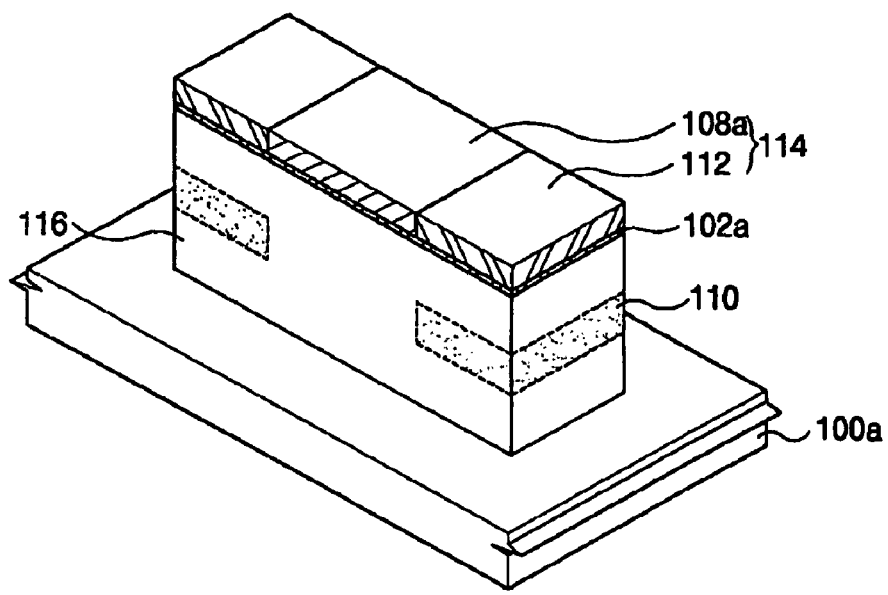

Referring to FIG. 2D, the substrate 100 is partially etched using the first hard mask 114 as an etching mask to form the active pattern 116 including the ion implantation regions 110. The active pattern 116 may be formed by a dry etching process. The active pattern 116 may have a height of about 2,000 Å or more. The active pattern 116 is vertically protruded from the etched substrate 100a. When the active pattern 116 is formed, the ion implantation regions 110 are partially exposed through sides of the active pattern 116. Hence, the pad oxide layer pattern 102a is interposed between the active pattern 116 and the first hard mask 114.

Figure 2E:
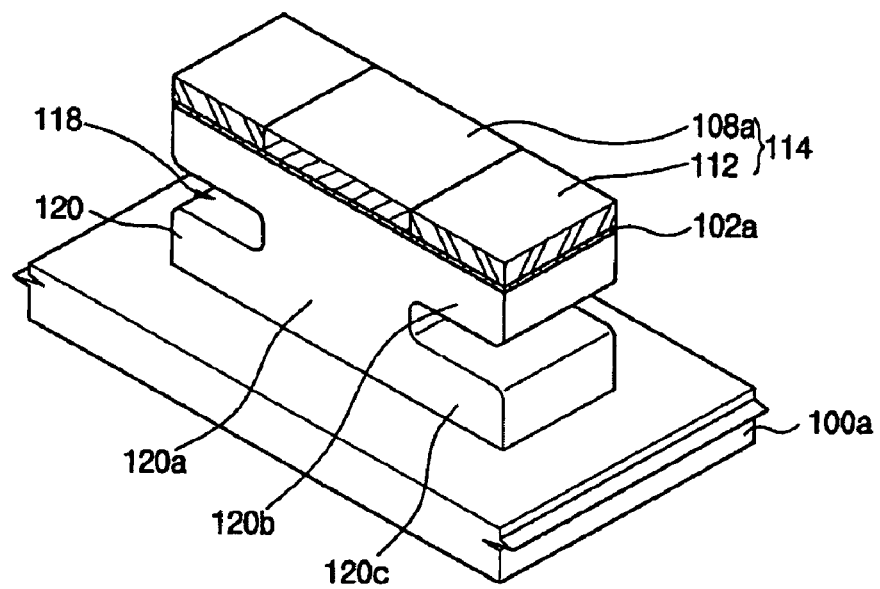

Referring to FIG. 2E, the etched substrate 100a including the active pattern 116 is immersed into an etching solution. The etching solution selectively removes the ion implantation regions 110 from the active region 116. Because the bonds of silicon atoms are broken by the implantation of the impurities in the ion implantation regions 110, the ion implantation regions 110 may be rapidly etched rather than other portions of the active pattern 116. Thus, the etching solution can selectively remove the ion implantation regions 110 from the active pattern 116. When the ion implantation regions 110 are removed, grooves 118 are horizontally formed from side surfaces of the active pattern 116, thereby forming an active structure 120 having the grooves 118 on the etched substrate 100a. The active structure 120 has a central portion 120a positioned between the grooves 118. The central portion 120a of the active structure 120 serves as a channel region of a transistor. The central portion 120a of the active structure 120 is vertically extended from the etched substrate 100a. Additionally, the active structure 120 has upper lateral portions 120b horizontally extended from the central portion 120a thereof. The upper lateral portions 120b of the active structure 120 are positioned on the grooves 118, respectively. The upper lateral portions 120b of the active structure 120 serve as source/drain regions of the transistor. Furthermore, the active structure 120 has lower lateral portions 120c horizontally extended from the central portion 120a thereof. The lower lateral portions 120c of the active structure 120 are positioned beneath the grooves 118, respectively. Hence, the active structure 120 substantially has an I-shaped cross section.

Figure 2F:
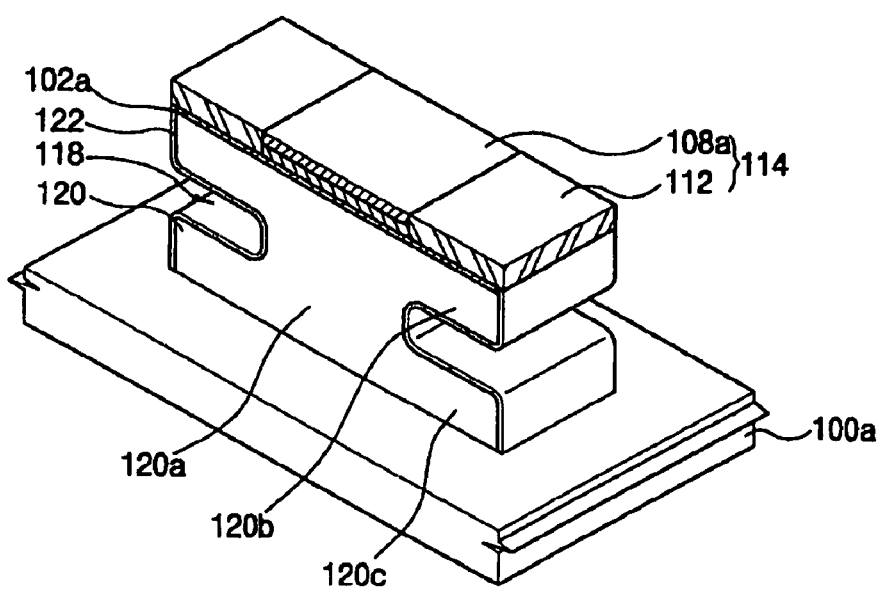

Referring to FIG. 2F, the active structure 120 is oxidized to form a side oxide layer 122. The side oxide layer 122 is continuously formed from the upper lateral portions 120b to the lower lateral portions 120c. The side oxide layer 122 may include silicon oxide and have a thickness of below about 60 Å. The side oxide layer 122 may be formed by thermally treating the active structure 120 under an oxygen atmosphere.

Figure 2G:
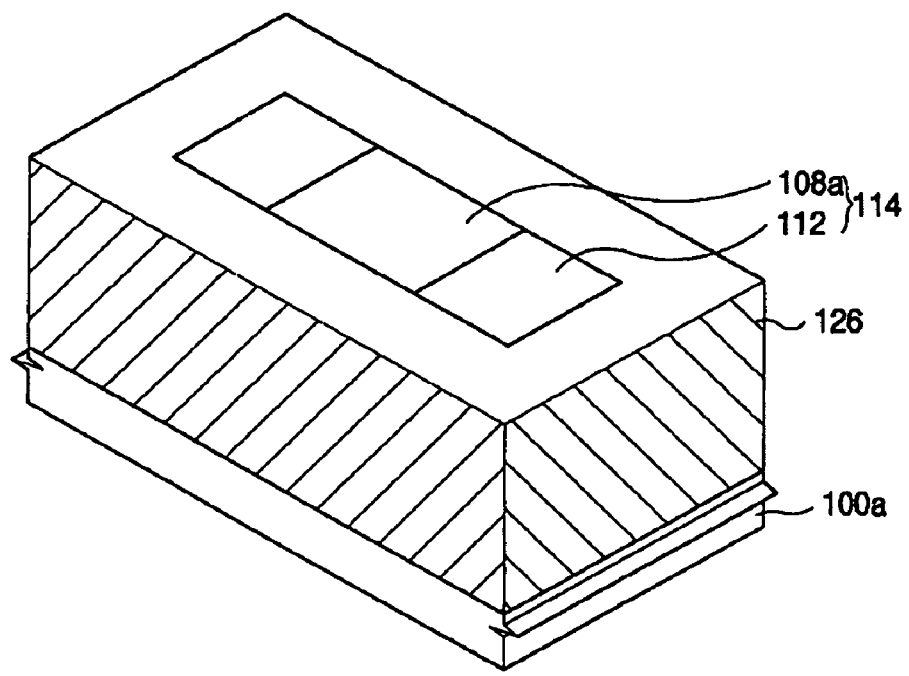

Referring to FIG. 2G, an insulation layer 126 is formed on the etched substrate 100a to completely bury the active structure 120 but to expose the first hard mask 114. The insulation layer 126 may include high density plasma (HDP) oxide, undoped silicate glass (USG), (TOSZ), spin on glass (SOG) like TOSZ manufactured by Tonnen, etc. The insulation layer 126 may be planarized by a planarization process such as a CMP process, an etch back process, or a combination process of CMP and etch back until the first hard mask 114 is exposed. Here, portions of the insulation layer 126 filling up the grooves 118 serve as blocking regions 130 for isolating the source/drain regions of the transistor.

Figure 2H:
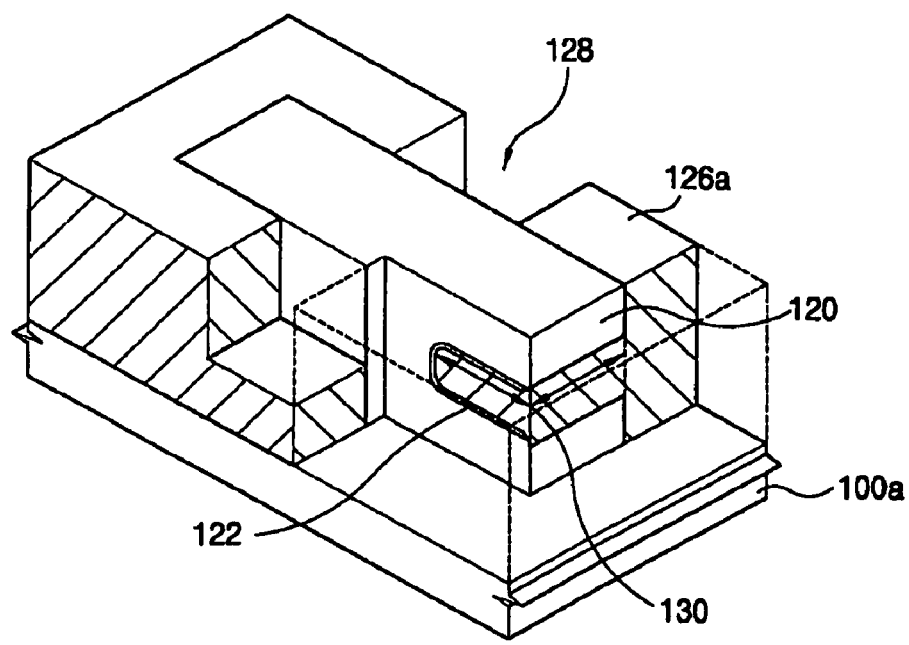

Referring to FIG. 2H, a photoresist pattern (not shown) is formed on the insulation layer 126 and the first hard mask 114. Then, the insulation layer 126 is partially etched using the photoresist pattern as an etching mask to form an insulation layer pattern 126a having trenches 128. The trenches 128 partially expose both side surfaces of the central portion 120a of the active structure 120, respectively. Here, the first upper and lower lateral portions 120b and 120c are covered with the insulation layer pattern 126a.

After forming the trenches 128, the photoresist pattern and the first hard mask 114 are removed from the active structure 120. In the etching process for removing the photoresist pattern and the first hard mask 114, an upper portion of the insulation layer pattern 126a is partially etched so that the insulation layer pattern 126a has a height substantially identical to that of the active structure 120.

Figure 2I:
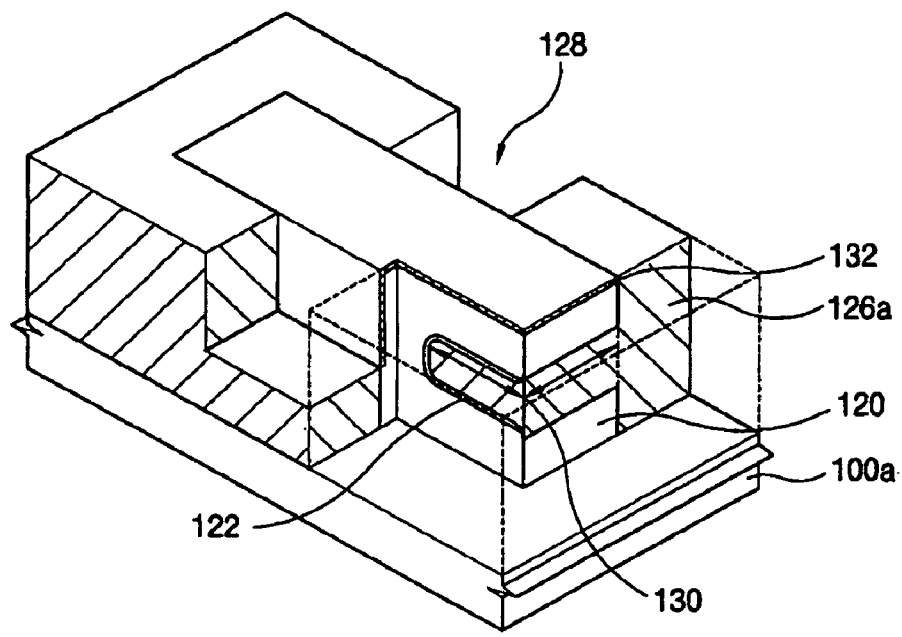

Referring to FIG. 2I, a gate dielectric layer 132 is formed on an upper face of the active structure 120 and on the exposed side surfaces of the central portion 120a of the active structure 120. In other words, the gate dielectric layer 132 covers all of the exposed faces of the active structure 120 after forming the insulation layer pattern 126a having the trenches 128. The gate dielectric layer 132 is formed of a conventional gate dielectric material such as silicon dioxide.

The gate dielectric layer 132 may include silicon oxide, silicon oxynitride, or hafnium oxide. When the gate dielectric layer 132 includes silicon oxide, the gate dielectric layer 132 may be formed by thermally oxidizing all of the exposed faces of the active structure 120 under an oxygen atmosphere.

Figure 2J:
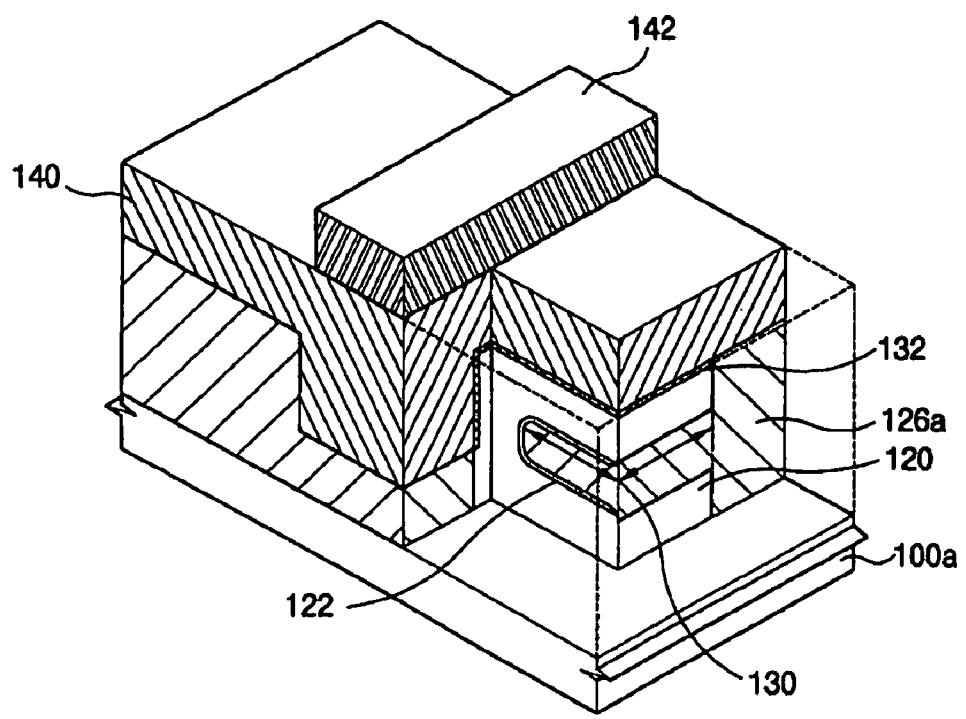

Referring to FIG. 2J, a conductive layer 140 is formed on the insulation layer pattern 126a and the gate dielectric layer 132 to fill up the trenches 128. The conductive layer 140 may include a conductive material such as doped polysilicon, metal, metal oxide, or metal nitride.

A second hard mask 142 for defining a gate electrode 140a (see FIG. 2K) is formed on the conductive layer 140. The second hard mask 142 may include a nitride such as silicon nitride.

Figure 2K:
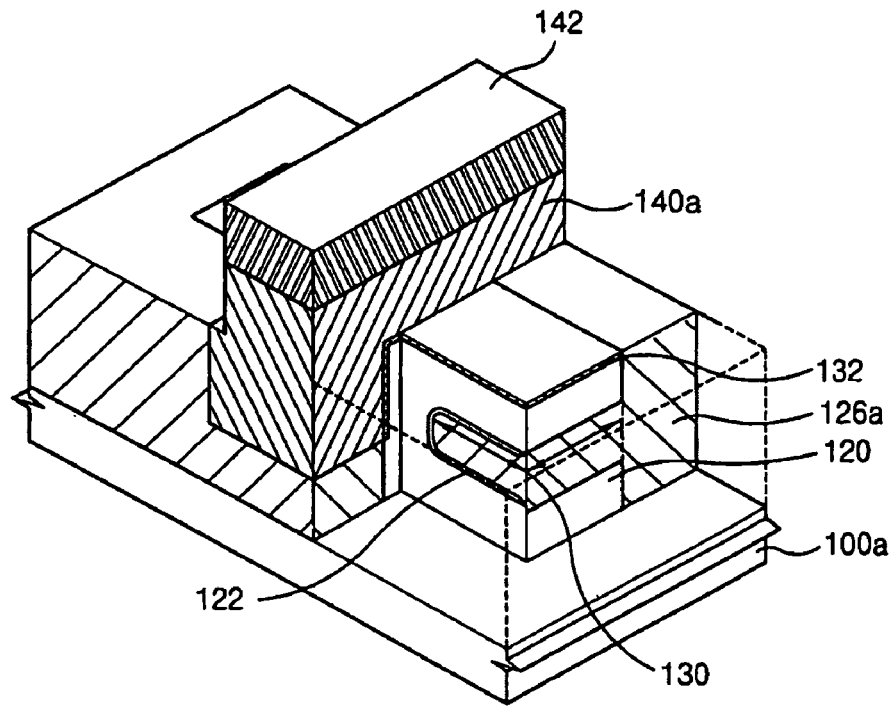

Referring to FIG. 2K, the conductive layer 140 is etched using the second hard mask 142 as an etching mask to thereby form the gate electrode 140a partially enclosing the active structure 120.

In particular, the gate electrode 140a has a central portion covering an upper face of the central portion 120a of the active structure 120 by interposing the gate dielectric layer 132 between the central portion of the gate electrode 140a and the central portion 120a of the active structure 120. Here, the central portion of the gate electrode 140a extends along a direction perpendicular to the active structure 120. The gate electrode 140a additionally has end portions filling up the trenches 128. That is, the end portions of the gate electrode 140 are positioned on the exposed side surfaces of the central portion 120a of the active structure 120 by interposing the gate dielectric layer 132 among the end portions of the gate electrode 140 and the exposed side surfaces of the central portion 120a of the active structure 120. As shown in FIG. 1, the central portion of the gate electrode 140a has a width W1 substantially narrower than a width W of the end portion of the gate electrode 140a.

Figure 2L:
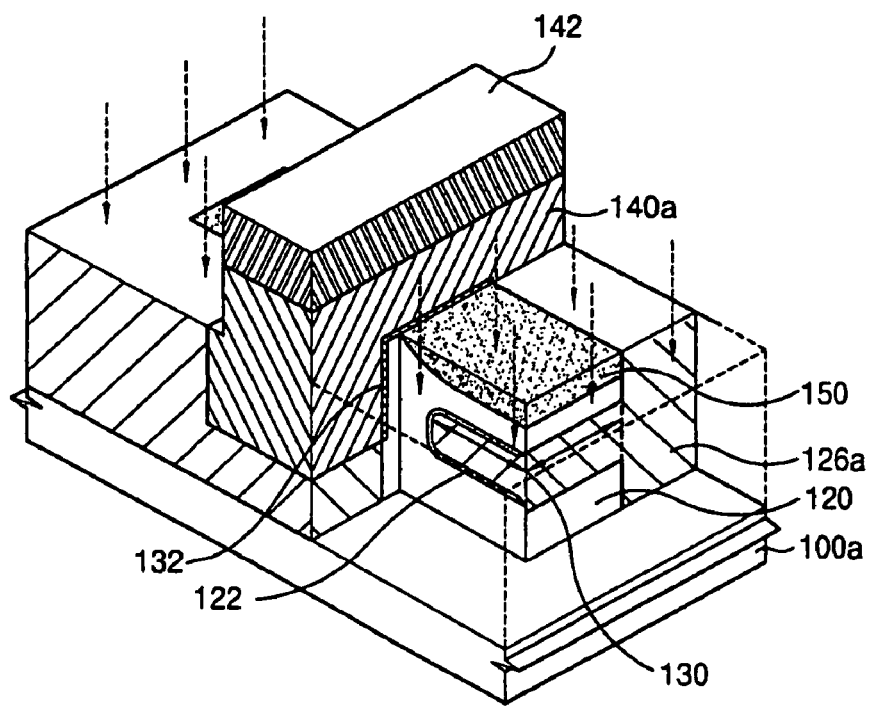

Referring to FIG. 2L, impurities are implanted into portions of the active structure 120 using the second hard mask 142 and the gate electrode 140a as ion implantation masks to form source/drain regions 150 of the transistor. Here, the impurities are implanted into the portions of the active structure 120 through the gate dielectric layer 132 with a predetermined energy. The source/drain regions 150 are positioned adjacent to the central portion of the gate electrode 140a. In other words, the source/drain regions 150 are formed along a direction perpendicular to the central portion of the gate electrode 140a.

After the source/drain regions 150 are formed, the gate dielectric layer 132 is removed from the active structure 120.

The source/drain regions 150 are electrically isolated from the substrate 100a by the blocking regions 130 formed in the grooves 118 of the active structure 120. Thus, when a high voltage is applied to the source/drain regions 150, extensions of depletion layers of the source/drain regions 150 may be prevented or a punch through effect of the transistor may be prevented.

The method of forming the fin type transistor of the present embodiment may be advantageously employed in forming a DRAM device, an SRAM device, a non-volatile memory device, etc.

FIGS. 3A to 3L are perspective views illustrating a method of forming a transistor in accordance with another embodiment of the present invention.

Figure 3A:
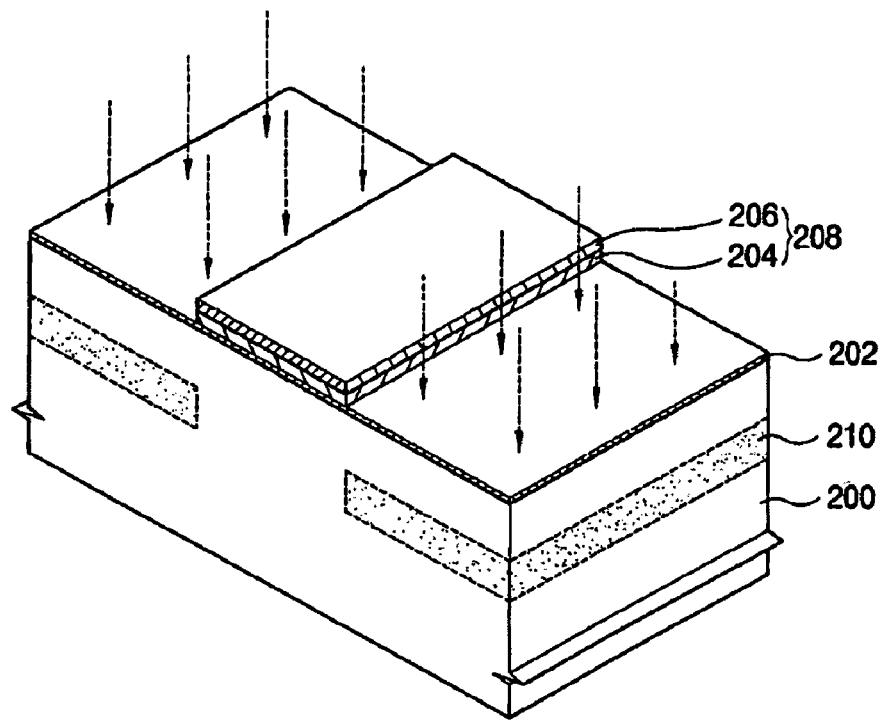
FIGS. 3A to 3L are perspective views illustrating a method of forming a transistor in accordance with yet another embodiment of the present invention.

Referring to FIG. 3A, a pad oxide layer 202 is formed on a substrate 200 by oxidizing a surface of the silicon substrate 200. The pad oxide layer 202 may have a thickness of about 100 Å.

A nitride layer and an oxide layer are sequentially formed on the pad oxide layer 202. For example, the nitride layer includes silicon nitride and the oxide layer includes silicon oxide. The nitride layer may have a thickness of about 400 Å and the oxide layer may have a thickness of about 300 Å.

After a photoresist pattern is formed on the oxide layer, the oxide layer and the nitride layer are partially etched using the photoresist pattern as an etching mask to form a preliminary dummy pattern 208 on the pad oxide layer 202. The preliminary dummy pattern 208 includes a first nitride layer pattern 204 formed on the pad oxide layer 202 and an oxide layer pattern 206 formed on the first nitride layer pattern 204. In the etching process of forming the preliminary dummy pattern 208, the pad oxide layer 202 serves as an etching stop layer to prevent damages to the substrate 200. The preliminary dummy pattern 208 may be formed using a dry etching process. Then, the photoresist pattern is removed from the preliminary dummy pattern 208 by an ashing process and/or a stripping process.

Impurities are implanted into portions of the substrate 200 using the preliminary dummy pattern 208 as an ion implantation mask to form ion implantation regions 210 at the portions of the substrate 200 adjacent to the dummy pattern 208.

Figure 3B:
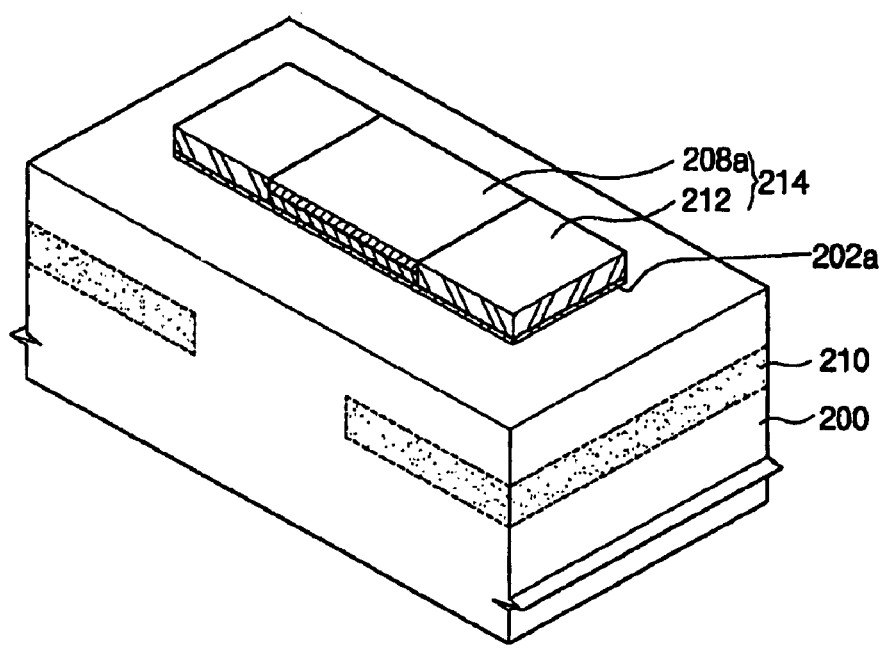

Referring to FIG. 3B, a first hard mask 214 for defining an active structure 216 including a dummy pattern 208a and second nitride layer patterns 212 is formed on the pad oxide layer 202. The first hard mask 214 includes a dummy pattern 208a and second nitride layer patterns 212. The second nitride layer patterns 212 make contact with both side surfaces of the dummy pattern 208a.

Figure 3C:
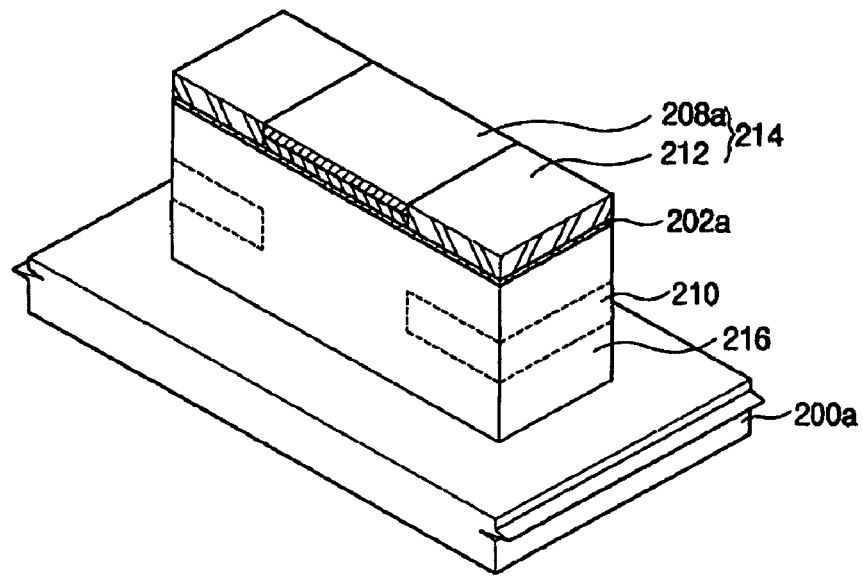

Referring to FIG. 3C, the substrate 200 is partially etched using the first hard mask 214 as an etching mask to form the active pattern 216. Since the active pattern 216 is formed by partially etching the substrate 200, the active pattern 216 is integrally formed with the etched substrate 200a. The ion implantation regions 210 are exposed through side surfaces of the active pattern 216.

Figure 3D:
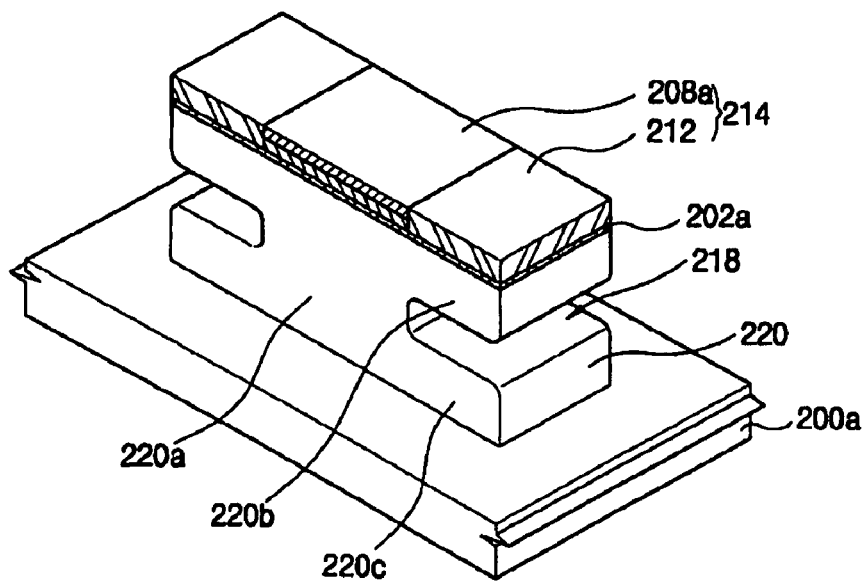

Referring to FIG. 3D, the etched substrate 200a is immersed with an etching solution to remove the ion implantation regions 210 form the active pattern 216. Because bonds between silicon atoms in the ion implantation regions 210 are broken, the ion implantation regions 210 are rapidly etched rather than other portions of the active pattern 216. Thus, only the ion implantation regions 210 are removed by immersing the etched substrate 200a having the active pattern 216 into the etching solution so that the ion implantation regions 210 are replaced with grooves 218. Hence, the active structure 220 including the grooves 218 is formed on the etched substrate 200a. The grooves 218 are horizontally formed from the side surfaces of the active structure 220. As described above, the active structure 220 has a central portion 220a, upper lateral portions 220b, and lower lateral portions 220c. The grooves 218 are respectively interposed between the upper lateral portions 220b and the lower lateral portions 220c. The central portion 220a vertically extends from a surface of the etched substrate 200a. The upper and lower lateral portions 220b and 220c are horizontally extended from the central portion 220a.

Figure 3E:
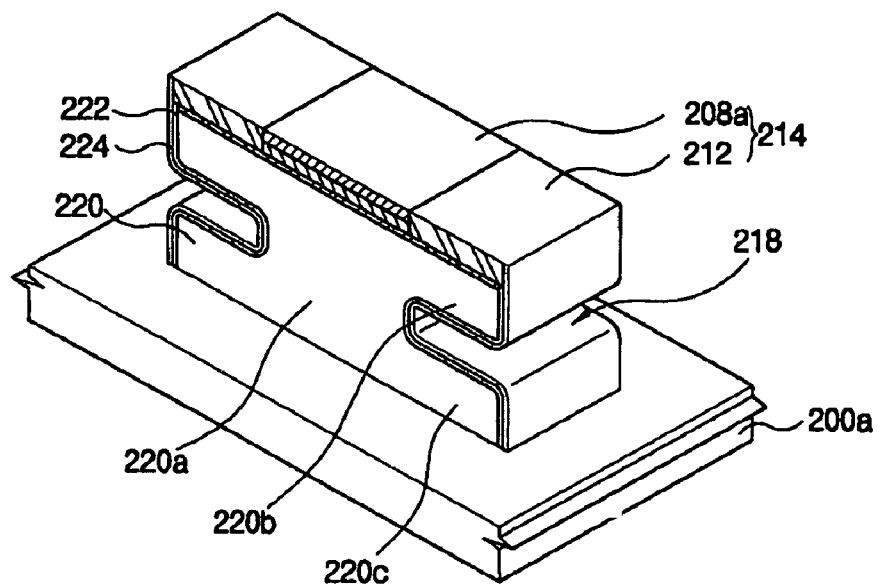

Referring to FIG. 3E, the active structure 220 is oxidized to form a side oxide layer 222. The side oxide layer 222 may have a thickness of about 60 Å or less. The side oxide layer 222 may be formed using silicon oxide. When the side oxide layer 222 includes silicon oxide, the active structure 220 is thermally treated under an oxygen atmosphere.

A liner layer 224 is formed on the side oxide layer 222 to cover side surfaces of the first hard mask 214. The liner layer 224 may have a thickness of about 60 Å or less. The liner layer 224 may be formed using a nitride such as silicon nitride by a chemical vapor deposition process.

Figure 3F:
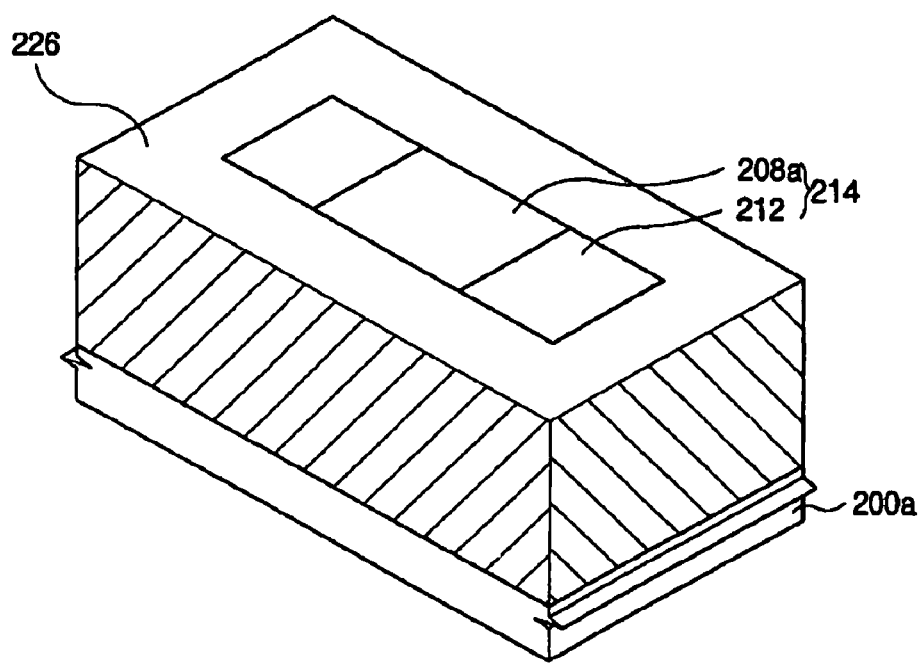

Referring to FIG. 3F, a preliminary insulation layer (not shown) is formed on the etched silicon substrate 200a to fully cover the active structure 220 and the first hard mask 214. Then, the preliminary insulation layer is planarized by a CMP process, an etch back process, or a combination process of CMP and etch back so that an insulation layer 226 is formed exposing an upper face of the first hard mask 214. Since the grooves 218 are not filled with the insulation layer 226, voids (not shown) are formed at portions of the active structure 220 where the grooves 218 are positioned. Here, the voids serve as blocking regions.

Figure 3G:
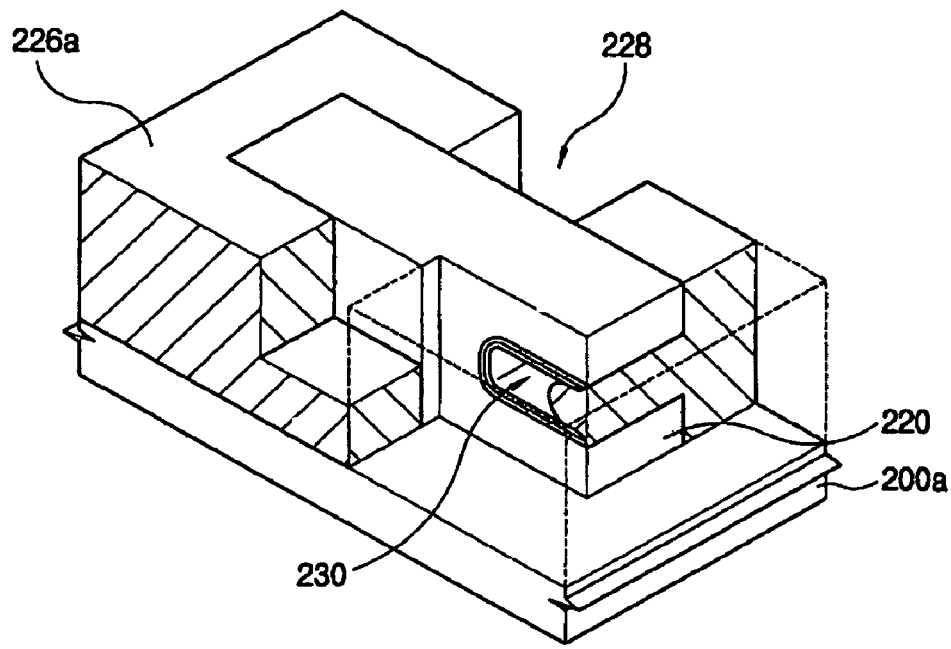

Referring to FIG. 3G, after a photoresist pattern (not shown) is formed on the insulation layer 226 and the first hard mask 214, the insulation layer 226 is partially etched using the photoresist pattern as an etching mask to form an insulation layer pattern 226a having trenches 228. The trenches 228 partially expose side surfaces of the central portion 220a of the active structure 220.

Then, the photoresist pattern and the first hard mask 214 are removed from the active structure 220. In the etching process for removing the photoresist pattern and the first hard mask 214, an upper portion of the insulation layer pattern 226a is partially etched so that the insulation layer pattern 226a has a height substantially identical to that of the active structure 220.

Figure 3H:
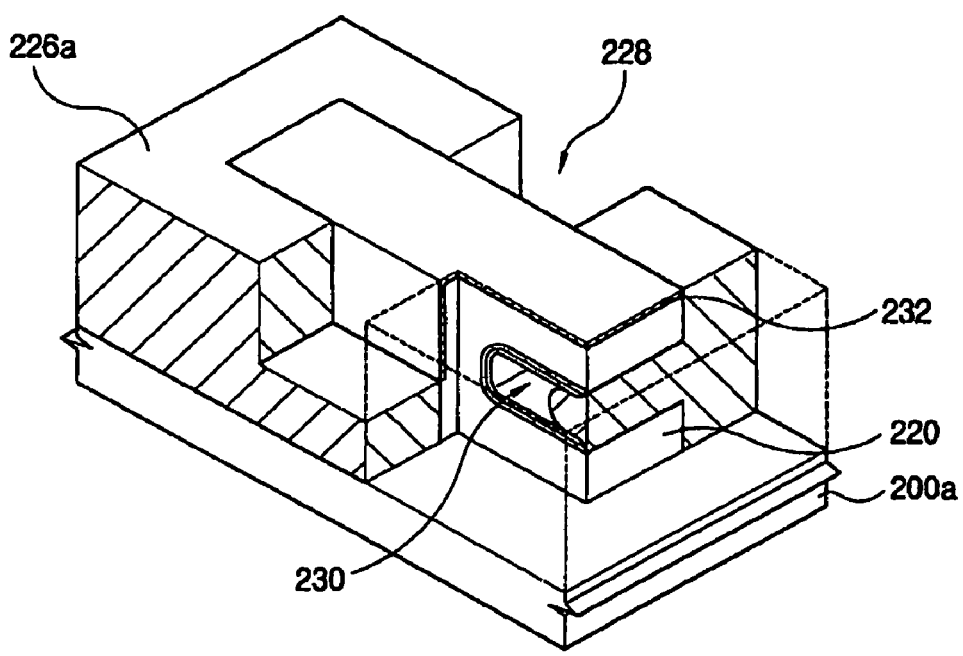

Referring to FIG. 3H, a gate dielectric layer 232 is formed on the active structure 220. Particularly, the gate dielectric layer 232 is formed on the upper face of the active structure 220 and the exposed side surfaces of the central portion 220a of the active structure 220. When the gate dielectric layer 232 includes silicon oxide, the gate dielectric layer 232 is formed by thermally oxidizing the exposed faces of the active structure 220 under an oxygen atmosphere.

Figure 3I:
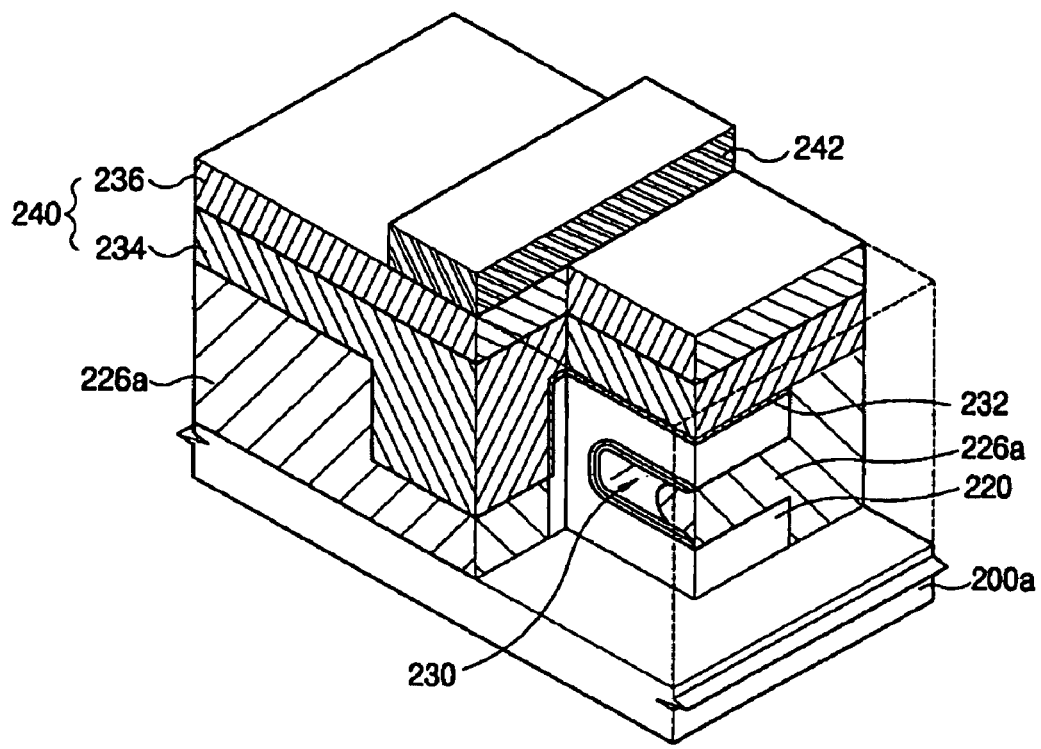

Referring to FIG. 3I, a conductive layer 240 is formed on the insulation layer pattern 226a and the gate dielectric layer 232 to fill the trenches 228. The conductive layer 240 includes a metal tungsten film 234 and a metal silicide film 236 formed on the metal film 234. The metal film 234 may include tungsten and the metal silicide film 236 may include tungsten silicide. Here, the metal film 234 fills the trenches 218.

A second hard mask 242 for defining a gate electrode 240a (see FIG. 3J) is formed on the conductive layer 240. The second hard mark 242 may include a material having an etching rate different from that of the insulation layer pattern 226a and that of the conductive layer 240.

Figure 3J:
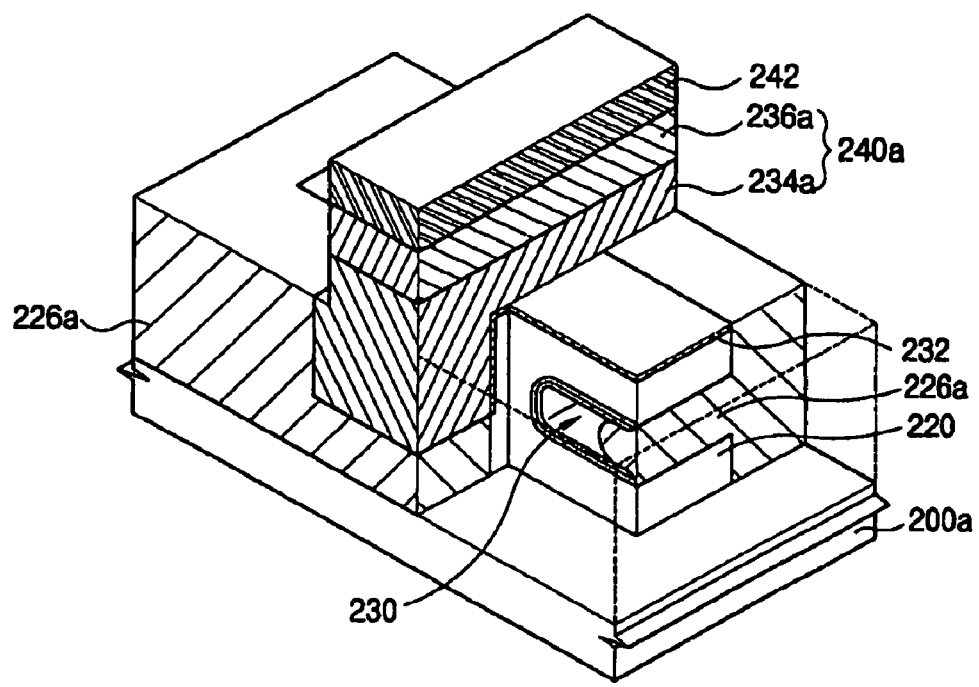

Referring to FIG. 3J, the conductive layer 240 is partially etched using the second hard mask 242 as an etching mask to form the gate electrode 240a on the active structure 220 and the insulation layer pattern 226a.

As described above, the gate electrode 240a includes a central portion crossing the upper face of the active structure 220, and end portions partially enclosing the side surfaces of the central portion 220a of the active structure 220. The trenches 218 are filled with the end portions of the gate electrode 240a. As shown in FIG. 1, the central portion of the gate electrode 240a has a width W1 substantially narrower than widths W1 of the end portions of the gate electrode 240a.

Meanwhile, the gate electrode 240a includes a metal film pattern 234a and a metal silicide film pattern 236a. Here, the metal film pattern 234a filling the trenches 218 is formed on the active structure 220 and the insulation layer pattern 226a. The metal silicide film pattern 236a is formed on the metal film pattern 234a.

Figure 3K:
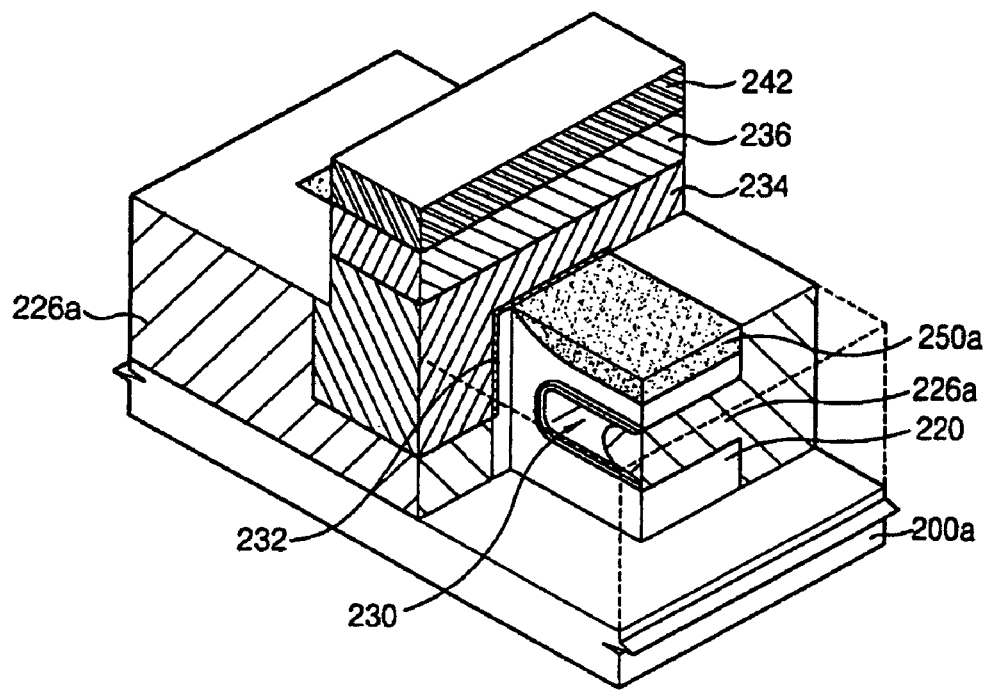

Referring to FIG. 3K, first impurities are implanted into upper portions of the active structure 220 using the second hard mask 242 and the gate electrode 240a as an ion implantation mask to form first impurity regions 250a. The first impurity regions 250a have relatively low impurity concentrations. The first impurities are implanted into the upper portions of the active structure with a low energy through the gate dielectric layer 232.

Figure 3L:
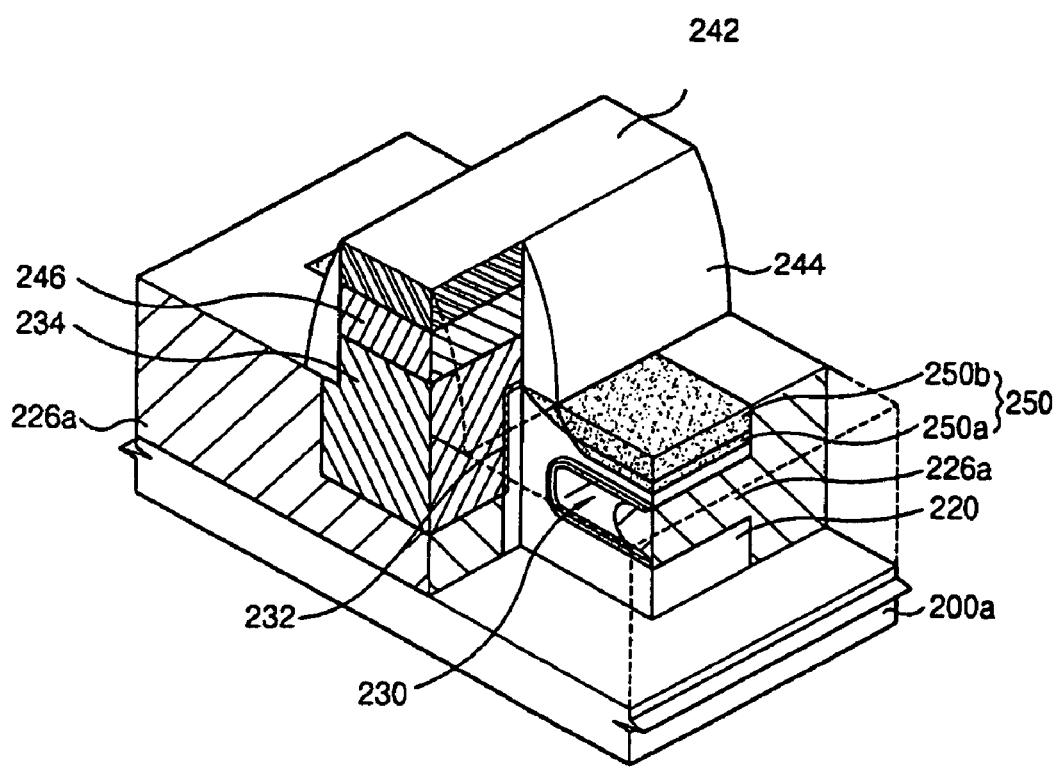

Referring to FIG. 3L, gate spacers 244 are formed on sidewalls of the gate electrode 240a and the second hard mask 246. The gate spacers 244 may be formed using a nitride such as silicon nitride.

Second impurities are implanted into the upper portions of the active structure 220 using the gate spacer 244 and the gate electrode 240a as ion implantation masks to form second impurity regions 250b partially overlapped with the first impurity regions 250a. The second impurity regions 250a have relatively high impurity concentrations. The second impurity regions 250a have a depth substantially deeper than those of the first impurity regions 250a. Accordingly, source/drain regions 250 including the first and second impurity regions 250a and 250b are formed at the upper portions of the active structure 220 adjacent to the gate electrode 240.

The above/described method of forming the fin type transistor may be advantageously employed in a formation of a DRAM device, an SRAM device, a non-volatile memory device, etc.

According to the present invention, although a gate structure has a narrow width, an effective channel length of a fin type transistor may be sufficiently ensured. Therefore, a short channel effect of the transistor may be prevented and the fin type transistor may have a high breakdown voltage.

Further, since an active structure is integrally formed with a substrate, and blocking regions are formed under the source/drain regions of the transistor, a junction capacitance of the source/drain regions may be reduced and a leakage current form the source/drain regions may be prevented.

Having described exemplary embodiments of the present invention, it is noted that modifications and variations can be made by persons skilled in the art in light of the above teachings. It is therefore to be understood that changes may be made in the particular embodiments of the present invention disclosed which is within the scope and the spirit of the invention outlined by the appended claims.

What is claimed is:

1. A method of forming a transistor, the method comprising:
   integrally forming an active structure with a semiconductor substrate, the active structure comprising a central portion upwardly extending from the substrate, lateral portions horizontally extending from the central portion, and grooves formed at the lateral portions, the central portion serving as a channel region;

forming an insulation layer on the substrate, the insulating layer exposing an upper face of the active structure;

forming blocking regions in the grooves;

partially etching the insulation layer to form an insulation layer pattern including trenches that partially expose side surfaces of the central portion of the active structure;

forming a gate structure on the active structure and the insulation layer pattern, the gate structure crossing the upper face of the active structure and partially enclosing the active structure; and implanting first impurities into upper portions of the active structure to form source/drain regions adjacent to the gate structure.

2. The method of claim 1, wherein forming the active structure comprises:

forming an ion implantation mask on the substrate;

implanting second impurities into portions of the substrate using the ion implantation mask to form ion implantation regions;

forming a hard mask that defines the active structure on the substrate;

partially etching the substrate using the hard mask to form an active pattern including the ion implantation regions; and removing the ion implantation regions to form the active structure having the grooves.

3. The method of claim 2, wherein the second impurities comprise hydrogen atoms or helium atoms, and the ion implantation regions have impurity concentrations of about $1 \times 10^{16}$ atoms/cm$^2$ to about $1 \times 10^{18}$ atoms/cm$^2$.

4. The method of claim 2, wherein forming the hard mask comprises:

forming a nitride layer on the substrate and the ion implantation mask;

partially removing the nitride layer to expose the ion implantation mask;

forming a photoresist pattern on the exposed ion implantation mask and the nitride layer; and partially etching the nitride layer and the ion implantation mask using the photoresist pattern as an etching mask to form the hard mask.

5. The method of claim 4, wherein the nitride layer is partially removed by a chemical mechanical polishing (CMP) process, and the ion implantation mask serves a polishing stop layer in the CMP process.

6. The method of claim 1, wherein the lateral portions of the active structure comprise upper lateral portions and lower lateral portions respectively extended from the central portion, and the grooves respectively interposed between the upper lateral portions and the lower lateral portions.

7. The method of claim 1, further comprising sequentially forming a side oxide layer and a liner layer on the active structure, after forming the active structure.

8. The method of claim 1, wherein the blocking regions comprise the insulation layer pattern that fills the grooves.

9. The method of claim 1, wherein the blocking regions comprise voids corresponding to the grooves.

10. The method of claim 1, wherein forming the gate structure comprises:

forming a gate dielectric layer on the upper face of the active structure and the exposed side surfaces of the central portion of the active structure;

forming a conductive layer on the gate dielectric layer and the insulation layer pattern to fill the trenches;

forming a nitride layer pattern on the conductive layer; and partially etching the conductive layer using the nitride layer pattern as an etching mask to form a gate electrode partially enclosing the active structure.

11. The method of claim 10, wherein the gate electrode comprises a central portion formed to cross the upper face of the active structure, and end portions formed to cover the exposed side surfaces of the central portion of the active structure.

12. A method of forming a transistor, the method comprising:

integrally forming an active structure with a semiconductor substrate, the active structure comprising a central portion upwardly extending from the substrate, lateral portions horizontally extending from the central portion, and grooves formed at the lateral portions, the central portion serving as a channel region;

forming an insulation layer on the substrate to expose an upper face of the active structure;

forming blocking regions in the grooves;

partially etching the insulation layer to form an insulation layer pattern including trenches that partially expose side surfaces of the central portion of the active structure;

forming a gate structure on the active structure and the insulation layer pattern, the gate structure crossing the upper face of the active structure and partially enclosing the active structure;

implanting first impurities into upper portions of the active structure to form first impurity regions adjacent to the gate structure;

forming gate spacers on sidewalls of the gate structure; and implanting second impurities into the upper portions of the active structure to form second impurity regions so that source/drain regions having lightly doped drain (LDD) structures are formed at the upper portions of the active structure.

* * * * *